(12) United States Patent
Zhang et al.

(10) Patent No.: US 9,513,328 B2
(45) Date of Patent: Dec. 6, 2016

(54) SYSTEMS AND METHODS FOR ELIMINATING MEASUREMENT ARTIFACTS OF EXTERNAL QUANTUM EFFICIENCY OF MULTI-JUNCTION SOLAR CELLS

(71) Applicant: Arizona Board of Regents, a body corporate of the State of Arizona Acting for and on behalf of Arizona State University, Scottsdale, AZ (US)

(72) Inventors: Yong-Hang Zhang, Scottsdale, AZ (US); Jing-Jing Li, Tempe, AZ (US); Swee Hoe Lim, San Jose, CA (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 473 days.

(21) Appl. No.: 13/795,660

(22) Filed: Mar. 12, 2013

(65) Prior Publication Data

US 2013/0278244 A1 Oct. 24, 2013

Related U.S. Application Data

(60) Provisional application No. 61/637,127, filed on Apr. 23, 2012.

(51) Int. Cl.
*H02S 50/00* (2014.01)
*G01R 31/26* (2014.01)
*G01R 31/40* (2014.01)
*H02S 50/10* (2014.01)

(52) U.S. Cl.
CPC ........... *G01R 31/2605* (2013.01); *H02S 50/00* (2013.01); *H02S 50/10* (2014.12)

(58) Field of Classification Search
CPC ..... G01R 31/26; G01R 31/2605; H02S 50/10; H02S 50/00
USPC ....................................................... 324/761.01
See application file for complete search history.

(56) References Cited

U.S. PATENT DOCUMENTS

| | | | | |
|---|---|---|---|---|
| 3,012,235 A | * | 12/1961 | Rochelle | G08C 15/00 340/870.18 |
| 5,220,181 A | * | 6/1993 | Kanai | C08G 77/60 136/255 |
| 8,073,645 B2 | * | 12/2011 | Fafard | H02S 50/10 136/249 |
| 2003/0059966 A1 | * | 3/2003 | Ellison | G01R 31/311 438/17 |

(Continued)

OTHER PUBLICATIONS

Li et al., "A Novel Mehtod to Eliminate the Artifacts of External Quantum Efficiency of Multi-Junction Solar Cells Caused by the Shunt Effect," Feb. 21, 2012, Proc of SPIE, vol. 8256 pp. 1-7.*

(Continued)

*Primary Examiner* — Son Le
*Assistant Examiner* — Akm Zakaria
(74) *Attorney, Agent, or Firm* — Snell & Wilmer L.L.P.

(57) ABSTRACT

A pulsed voltage bias method and/or pulsed light bias method may be used to reduce, minimize, and/or eliminate external quantum efficiency measurement artifacts of multi-junction solar cells, for example artifacts caused by the shunt effect. In this manner, multi-junction solar cells may be designed and constructed with improved performance, efficiency, and the like.

18 Claims, 10 Drawing Sheets

(56) References Cited

U.S. PATENT DOCUMENTS

| | | | |
|---|---|---|---|
| 2007/0256729 A1* | 11/2007 | Vijh | H01L 31/076 136/252 |
| 2010/0201374 A1* | 8/2010 | Vasilyev | G01R 31/2656 324/538 |
| 2012/0006408 A1* | 1/2012 | El-Ghoroury | B82Y 20/00 136/260 |
| 2012/0125418 A1* | 5/2012 | Puetz | B82Y 20/00 136/255 |
| 2013/0240364 A1* | 9/2013 | Gamelin | H01G 9/20 205/91 |

OTHER PUBLICATIONS

King et al. (2005)., "Pathways to 40%-efficient concentrator photovoltaics," 20th Euro PVSEC, 118-123.

King et al. (2007), "Advances in high-efficiency III-V multijunction solar cells," Adv. Optoelectron. 2007, 29523-29530.

Law et al., (2010). "Future technology pathways of terrestrial III-V multijunction solar cells for concentrator photovoltaic systems," Sol. Energ. Mater. 94, 1314-1318.

Meusel et al., (2003). "Spectral response measurements of monolithic GaInP/Ga(In)As/Ge triple-junction solar cells: Measurement artifacts and their explanation," Prog. Photovolt Res. Appl. 11, 499-514 (2003).

Lim et al., (Nov. 30, 2011). "Luminescence coupling effects on multijunction solar cell external quantum efficiency measurement," Prog. Photovolt Res. Appl., 21, 344-350.

Li et al., (Dec. 2, 2011). "Combined Effects of Shunt and Luminescence Coupling on External Quantum Efficiency Measurements of Multijunction Solar Cells," IEEE J. Photovolt., 1, 225-230.

Li et al., (Mar. 19, 2012). "A novel method to eliminate the measurement artifacts of external quantum efficiency of multi-junction solar cells caused by the shunt effect", Proc. SPIE, 8256.

Kirchartz et al. (2007). "Electroluminescence analysis of high efficiency Cu(In,Ga)Se2 solar cells." J. Appl. Phys. 102, 104510.

Rau, (2007). "Reciprocity relation between photovoltaic quantum efficiency and electroluminescent emission of solar cells." Phys. Review B; 76, 085303.

Meusel et al. (2006). "Characterization of monolithic III-V multijunction solar cells—challenges and application." Solar Energy Materials and Solar Cells; 90, 3268-3275.

Warner et al. (2004). "Measurement and characterization of triple junction solar cells using a close matched multizone solar simulator." Proceedings of SPIE 2004, 5520, 45-55.

Lim et al. (2010). "Analysis of spectral photocurrent response from multi-junction solar cells under variable voltage bias." Proceedings of the 35th IEEE Photovoltaics Specialist Conference, 712-716.

Siefer et al. (2010). "External quantum efficiency measurements of germanium bottoms subcells: measurement artifacts and correction procedures." Proceedings of the 35th IEEE Photovoltaics Specialist Conference, 704-707.

Yoon et al. (2003). "Radiative coupling effects in GaInP/GaAs/Ge multijunction solar cells." Proceedings of the 3rd World Conference on Photovoltaic Energy Conversion, 745-748.

Steenbergen et al. (2010). "Optically-addressed two-terminal multicolor photodetector." App. Phys. Lett., 97, 161111.

Steenbergen et al. (Dec. 25, 2010). "Effects of varying light bias on an optically-addressed two-terminal multicolor photodetector." Infrared Physics and Technology, 54, 292-295.

Marti et al. (1996). "Limiting efficiencies for photovoltaic energy conversion in multigap systems." Solar Energy Materials and Solar Cells, 43, 203-222.

Brown et al. (2002). "Radiative coupling as a means to reduce spectral mismatch in monolithic tandem solar cell stacks theoretical considerations." Proceedings of the 29th IEEE Photovoltaics Specialists Conference, 868-871.

Baur et al. (2007). "Effect of optical coupling in III-V multilayer systems." App. Phys. Lett., 90, 192109.

King et al. (2000). "New methods for measuring performance of monolithic multi-junction solar cells." Proceedings of the 28th IEEE Photovoltaics Specialists Conference, 1197-1201.

Wang et al. (2007). "Determination and improvement of spontaneous emission quantum efficiency in GaAs/AlGaAs heterostructures grown by molecular beam epitaxy." Phys. Stat. Sol. (b), 244, 2740-2751.

* cited by examiner

SYSTEMS AND METHODS FOR ELIMINATING MEASUREMENT ARTIFACTS OF EXTERNAL QUANTUM EFFICIENCY OF MULTI-JUNCTION SOLAR CELLS

CROSS REFERENCE TO RELATED APPLICATIONS

This application claims priority to, and the benefit of, U.S. Provisional Application Ser. No. 61/637,127 entitled "Systems and Methods for Elimination Measurement Artifacts of External Quantum Efficiency of Multi-Junction Solar Cells" and filed Apr. 23, 2012, which is incorporated herein by reference.

FEDERALLY SPONSORED RESEARCH OR DEVELOPMENT

This invention was made with government support under NSF contract number 1002114, and Air Force Research Lab (Space Vehicles Directorate) contract number FA9453-08-2-0228. The Government has certain rights in the invention.

TECHNICAL FIELD

The present disclosure relates to electronic circuits, and in particular to methods and numerical techniques for testing and characterization of circuits including multi-junction solar cells.

BACKGROUND

Solar cells relate to technologies for the collection and conversion of solar energy to electrical energy. The efficiency of solar cells may be measured in terms of "external quantum efficiency" or "EQE." EQE may be defined as the ratio of a number of charge carriers collected by a solar cell to the number of photons having a particular energy (e.g., wavelength) shining on the solar cell. Thus, EQE may be used to measure an efficiency of energy collection associated with a particular solar cell.

Solar cells may be constructed from a variety of materials (e.g., germanium, to name but one), and, depending upon the material or materials comprising a particular solar cell, the cell may best absorb energy in a particular part of the solar spectrum. In general, a particular solar cell (constructed from one or more materials) will operate most efficiently (i.e., the solar cell will have an EQE closest to 1 or 100%) in a particular frequency range.

In view of the relatively narrow absorption range associated with typical solar cells, and in order to collect a larger proportion of energy in the solar spectrum, many modern solar collection devices incorporate a variety of monolithically layered solar collecting materials or "subcells" where each subcell is best suited to absorption of photons in a particular frequency range. The boundary or interface between one subcell and another subcell may be referred to herein as an "interface," and these devices may be referred to as multi-junction solar cells ("MJSCs" for short). Where MJSCs are used, a top subcell may be constructed to absorb light of a shorter wavelength, while a bottom subcell may be constructed to absorb light of a longer wavelength. Intermediate subcells may absorb light in the spectrum between light absorbed by the top and bottom subcells.

As the number of interfaces used in the construction of MJSCs increases, it is increasingly important that the subcells are current matched (e.g., because the current through an MJSC may be limited by the minimum current flowing through a subcell in a series coupled set of subcells). To achieve current matched subcells, EQE calculations are often used in the design and development of MJSCs. Because EQE is a measure of the photocurrent generated by each subcell under a certain portion of the solar spectrum, the EQE of each subcell in an MJSC may be measured during a design phase to ensure that the subcells are properly current matched.

The accurate measurement of EQE is important to the design and development of MJSCs. For monolithically integrated MJSCs, subcells may be series connected and coupled both electrically and optically. The low shunt resistance of a subcell and the luminescence coupling between subcells may cause EQE measurement artifacts that obscure the subcell intrinsic properties.

Simple application of a particular portion of the solar spectrum to an MJSC may well excite some current in a subcell that is not precisely tuned to that portion of the spectrum, but which is nevertheless at least partially responsive to that portion of the spectrum. Moreover, if subcells which are not under test are not light biased during testing to achieve substantial output currents, these subcells may current limit the subcell under test (which may interfere with collection of an EQE value for the test subcell). Thus, it is typically necessary to DC light bias and/or DC voltage bias subcells not under test to make the subcell under test the current limiting subcell.

Due to the effects described above, and in spite of the precautions taken against their occurrence, measurement artifacts (e.g., leakage currents) are often observed in the outputs of tested subcells (e.g., often measurement artifacts are observed for subcells with low shunt resistances and/or strong luminescence coupling effects). These measurement artifacts are characterized, for example, by the occurrence of erroneous output responses outside the wavelength or frequency range to which a subcell is tuned, and/or by the occurrence of low output responses within a subcell's tuned wavelength range. These measurement artifacts may be decreased by applying a DC light and/or voltage bias. However, the difference between the measured apparent EQE and the true EQE may still be very substantial. Thus, improved techniques for characterizing the EQE of subcells under test are desirable.

SUMMARY

Systems and methods for reducing, minimizing, and/or eliminating external quantum efficiency measurement artifacts in multi-junction solar cells (MJSC) are disclosed. In various embodiments, a DC light bias is applied to a first subcell in the MJSC, wherein the first subcell is not under test. A DC voltage bias may be applied to the MJSC. A pulsed voltage bias may be applied to the first subcell, and the external quantum efficiency of a second subcell may be measured while the pulsed voltage bias is being applied. In various embodiments, the magnitude of the pulsed voltage bias may be varied in order to reduce the measurement artifacts.

In various embodiments, a method for reducing external quantum efficiency artifacts in a MJSC comprising a top subcell, a middle subcell, and a bottom subcell may comprise applying a DC light bias to the top subcell and the middle subcell, wherein the top subcell and the bottom subcell are not under test. A DC voltage bias may be applied to the MJSC, and a pulsed bias may be applied to the middle subcell. The external quantum efficiency of the bottom subcell may be measured while the pulsed bias is being applied. In various embodiments, a magnitude of the pulsed bias necessary to eliminate the measurement artifacts may be determined by iteratively measuring a photocurrent generated by the bottom subcell.

In various embodiments, a system for reducing external quantum efficiency measurement artifacts in a MJSC is disclosed. The system may include a MJSC comprising a top subcell, a middle subcell, and a bottom subcell. The system may include a DC light bias generator configured to apply a DC light bias to at least one of the top subcell and the middle subcell. The system may further include a DC voltage bias generator configured to apply a DC voltage bias to the MJSC and a pulsed bias generator configured to apply a pulsed bias to the middle subcell. The system may further include a chopped monochromatic light generator configured to cause the bottom subcell to create an output current, and an ammeter configured to measure an external quantum efficiency of the bottom subcell while the pulsed bias generator applies the pulsed bias to the middle subcell.

BRIEF DESCRIPTION OF THE DRAWINGS

With reference to the following description, appended claims, and accompanying drawings:

DETAILED DESCRIPTION

Figure 1:
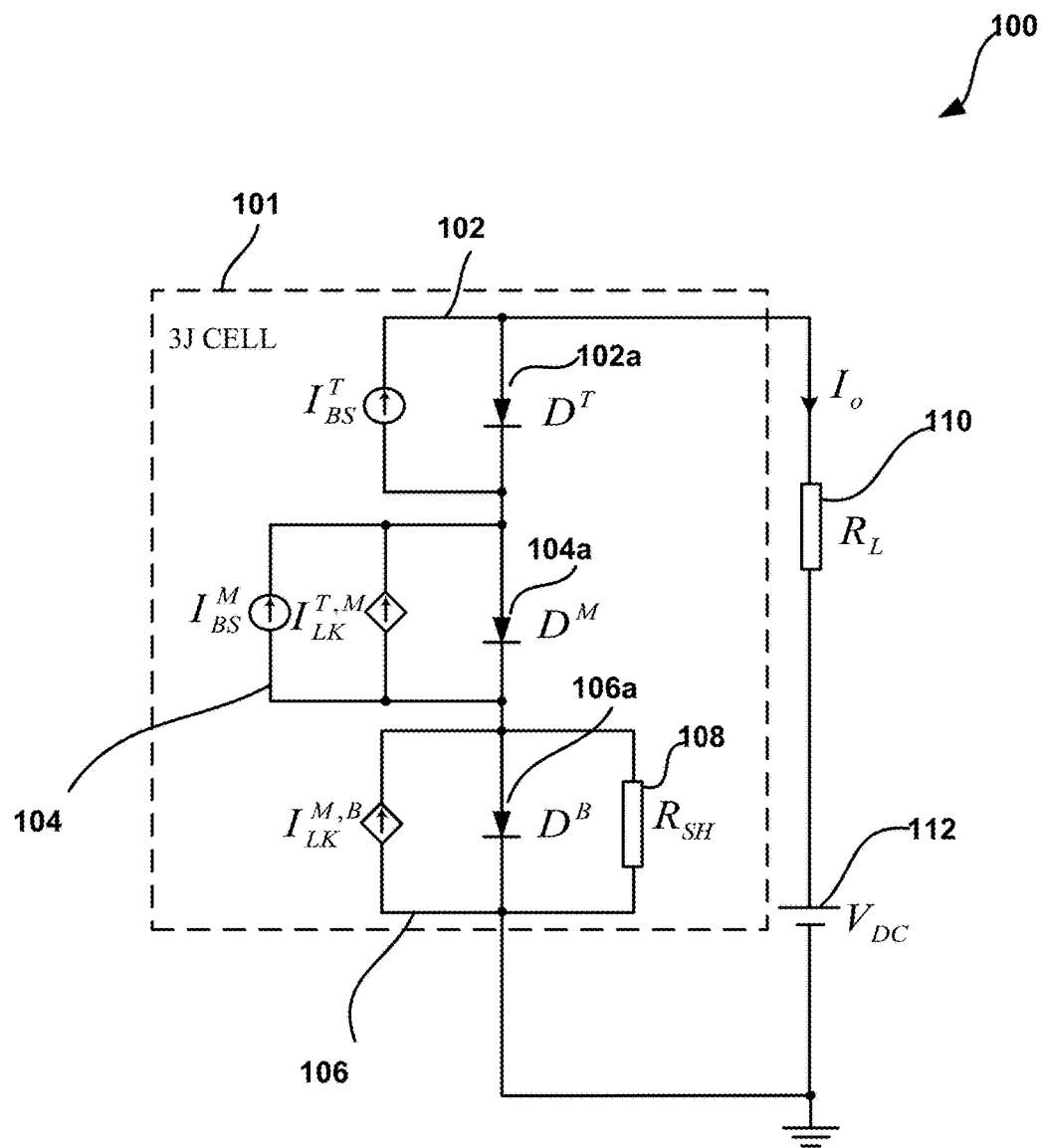
FIG. 1 illustrates an equivalent circuit of a bottom subcell of a triple-junction solar cell under voltage and light biases in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the appended claims.

For the sake of brevity, conventional techniques for solar cell construction, design, and testing (including measuring EQE of test solar cells or subcells) may not be described in detail herein. Furthermore, the connecting lines shown in various figures contained herein are intended to represent exemplary functional relationships and/or physical or communicative couplings between various elements. It should be noted that many alternative or additional functional relationships or physical or communicative connections may be present in a practical MJSCs and/or a method of testing or characterizing the behavior of the same.

In accordance with principles of the present disclosure, the design, development, and testing of MJSCs and related methods can reduce or eliminate erroneous output responses produced by subcells operating outside a designed or tuned wavelength range, and/or eliminate measurement artifacts produced by subcells operating within a tuned wavelength range.

Principles of the present disclosure are described hereinafter by reference to the accompanying drawings that show embodiments of principles of the present disclosure and in which like numbers refer to like elements throughout. Principles of the present disclosure may, however, be embodied in many different forms and should not be construed as limited to the embodiments set forth herein. Rather, these embodiments are examples of principles of the present disclosure.

It will be appreciated that while principles of the present disclosure are discussed herein by way of reference to a multi-junction solar cell comprising three subcells, principles of the present disclosure are applicable to multi-junction solar cells having any number of subcells. Embodiments illustrated herein are provided by way of illustration and not of limitation.

Further, as used herein, DC signals may be denoted as capital letters with capital subscripts, AC signals may be denoted as small letters with small subscripts, and signals consisting of both DC and AC components may be set in capital letters with small subscripts.

It will be appreciated that principles of the present disclosure may be applied to characterize the EQE of one or more subcells in a multi-junction solar cell. In various embodiments, a system for characterizing the EQE of one or more subcells in a multi-junction solar cell comprises a scanning monochromatic light, a pulsed bias source (e.g., a pulsed voltage source, a pulsed light source, and/or the like), a DC voltage bias generator, and a lock-in amplifier configured to measure voltage.

With reference now to FIG. 1, an exemplary MJSC 100 is illustrated. An MJSC 100 may, in various exemplary embodiments, be represented by an equivalent circuit 101 of a triple-junction solar cell under voltage and light biases. As shown, the equivalent circuit 101 may include a top subcell equivalent circuit 102, a middle subcell equivalent circuit 104, and/or a bottom subcell equivalent circuit 106. MJSC 100 may further include a shunt resistance $R_{SH}$ 108, a load resistance $R_L$ 110, and/or a DC voltage bias $V_{DC}$ 112. Each subcell equivalent circuit 102, 104, and/or 106 may comprise a diode, $D^T$ 102a, $D^M$ 104a, and $D^B$ 106a, respectively.

As described above, traditional EQE test methods utilize DC light and/or DC voltage biases to reduce (or attempt to reduce) measurement artifacts in one or more EQE measurements. Indeed, as subcell operating points may be based upon DC bias conditions as well as upon coupling effects between subcells 102, 104, and/or 106, it is often desirable to set one or more DC voltage biases and/or DC light biases in order to tune subcell operating points and/or minimize or reduce any measurement artifacts which may arise. In various embodiments, a DC light bias may be supplied by a broad band light source and/or a plurality of light sources supplying individual wavelengths and/or portions of the solar spectrum.

In various exemplary embodiments, the DC voltage bias $V_{DC}$ 112 may be used in conjunction with the load resistor $R_L$ 110 to provide a voltage bias to the MJSC 100. To this end, $V_{DC}$ 112 may be distributed to the series connected subcells 102, 104, and 106 as well as the load resistor. Thus, the sum of the voltages output by subcell 102, subcell 104, and subcell 106 (i.e., $V^T + V^M + V^B$, respectively) are equal to the sum of the DC bias voltage applied to the MJSC 100, $V_{DC}$ 112, and the voltage, $V_{RL}$, across the load resistor. This relationship may be written as follows:

$$V^T + V^M + V^B = V_{DC} + V_{RL} \qquad \text{(Equation 1)}$$

In addition, the I-V relationships for each of the three subcells 102, 104, and 106, respectively, may be written as follows:

$$I_O = I_{SC}^T - I_0^T e^{\frac{qV^T}{n^T kT}} \qquad \text{(Equation 2)}$$

(I-V relationship for subcell 102), $$I_O = I_{SC}^M - I_0^M e^{\frac{qV^M}{n^M kT}} \qquad \text{(Equation 3)}$$

(I-V relationship for subcell 104), and $$I_O = I_{SC}^B - \left( I_0^B e^{\frac{qV^B}{n^B kT}} + \frac{V^B}{R_{SH}} \right) \qquad \text{(Equation 4)}$$

(I-V relationship for subcell 106).

With respect to the notation used in these I-V relationships, $I_o^T$, $I_o^M$ and $I_o^B$ refer to the saturation currents and $n^T$, $n^M$ and $n^B$ refer to the ideality factors of the three subcells 102, 104, and 106, respectively. Further, the short-circuit currents of the three subcells 102, 104, and 106, respectively, under DC light biases may be written as follows:

$$I_{SC}^T = I_{BS}^T \text{ (short circuit current for subcell 102)} \qquad \text{(Equation 5)},$$

$$I_{SC}^M = I_{BS}^T + I_{LK}^{T,M} \text{ (short circuit current for subcell 104)} \qquad \text{(Equation 6), and}$$

$$I_{SC}^B = I_{LK}^{M,B} \text{ (short circuit current for subcell 106)} \qquad \text{(Equation 7)}.$$

Referring to the notation used in these short-circuit equations, $I_{BS}^T$ and $I_{BS}^M$ represent the photocurrents generated by the DC light biases on subcell 102 and subcell 104, respectively (which may comprise, respectively, indium gallium phosphide (InGaP) and/or indium gallium arsenide (InGaAs), and/or other suitable alloys). Further, $I_{LK}^{T,M}$ and $I_{LK}^{M,B}$ represent the photocurrents generated by leakage light transmitted from subcell 102 to subcell 104 (top to middle) and from subcell 104 to subcell 106 (middle to the bottom), respectively. Thus, the short-circuit current in subcell 102 is simply the current produced by the DC bias light applied to the subcell. Similarly, the short-circuit current in subcell 104 is equal to the current produced by the bias light incident on its surface plus the leakage current flowing from the overlaid subcell 102. Finally, the short-circuit current in subcell 106 is equal to the leakage current flowing from the overlaid subcell 104; note that the short-circuit current in subcell 106 does not include a term to account for DC bias light, because subcell 106, if under test, would not receive a DC bias.

Regarding the leakage currents $I_{LK}^{T,M}$ and $I_{LK}^{M,B}$, these may be modeled as current controlled current sources, i.e., $I_{LK}^{T,M} = \alpha_{LK}^{T,M} I_{BS}^T$ and $I_{LK}^{M,B} = \alpha_{LK}^{M,B} I_{BS}^M$, where the leakage strengths $\alpha_{LK}^{T,M}$ and $\alpha_{LK}^{M,B}$ are constant at particular wavelengths. Further, in general and as discussed herein, the photocurrent generated in a lower subcell by radiative recombination in the subcell above it (also known as luminescence coupling), is treated as being negligible, and so the foregoing equations do not include a term to account for recombinative photoelectric losses in the leakage currents reaching lower subcells. However, principles of the present disclosure contemplate inclusion of terms to account for recombinative photoelectric losses.

Moreover, because subcell 106 (which may comprise a germanium (Ge) subcell) may often exhibit a soft (or low) breakdown voltage when it is reverse biased, the shunt resistance $R_{SH}$ associated with the subcell 106 may decrease with decreasing voltage (the "shunt effect"). Thus, in order to minimize the shunt effect, the Ge subcell 106 may be weakly forward biased or reverse biased in the measurements (depending at least in part on $V_{DC}$).

In various exemplary embodiments, although DC voltage and/or DC light biasing one or more subcells 102, 104, and/or 106 may help to reduce measurement artifacts in measured EQE values, simple DC light and/or voltage biasing techniques may not completely eliminate small measurement artifacts in EQE measurements. To demonstrate, a small signal analysis, as shown below, may be used to model the AC response of an MJSC 100 under test (e.g., where a top subcell 102 and a middle subcell 104 are DC and/or light biased, and where a bottom subcell 106 is not biased, but instead exposed to chopped monochromatic light (e.g., generated by a sun simulator or the like) in a wavelength range to which the subcell 106 is tuned.

Accordingly, in an exemplary small signal analysis, in general and in various embodiments, a photocurrent, $i_{ph}$, generated under the chopped monochromatic light is typically much smaller than DC currents generated by each subcell 102 and 104 in response to their respective voltage and/or light biases. Therefore, the photocurrent $i_{ph}$ may be treated as a small signal perturbation on the more prevalent DC characteristics exhibited at the outputs of each of the biased subcells (in this example, subcells 102 and 104). Thus, a small signal analysis is appropriate, and the difference between the EQE measured at a test subcell 106 and the true EQE of the test subcell 106 (as the current $I_o$ at the bottom subcell 106 may be influenced by the leakage current, $I_{LK}^{M,B}$, output by the overlying subcell 104) comes from the difference in the output current measured from the triple junction solar cells and the photocurrent $i_{ph}$ generated in a subcell. In other words, measurement artifacts (i.e., the difference between the true EQE and measured EQE) result from the subcells (e.g., 102 and 104) which are DC biased but which also contribute (because they absorb photons, weakly, in the test wavelength range) to the photocurrent, $i_{ph}$. Thus, DC biasing the subcells under test results in an imperfect or somewhat inaccurate measurement of the EQE of the test subcell 106, because the DC biased subcells 102 and 104 contribute small signal outputs to the total output photocurrent.

Continuing with this example, in the Ge wavelength range (which, in various embodiments may comprise the wavelength range to which test subcell 106 is tuned), the I-V relation of the Ge subcell 106 under the chopped monochromatic light may be written as follows:

$$I_O + i_o = (I_{LK}^{M,B} + i_{ph}^b) - \left[ I_0^B e^{\frac{q(V^B + v^b)}{n^T kT}} + \frac{V^B + v^b}{r_{sh}} \right],$$ (Equation 8)

With reference to the notation used in Equation 8 (which adds an output term $i_o$ to account for the photocurrent in subcell 106), $i_{ph}^b$ and $v^b$ may represent the photocurrent and voltage drop, respectively, of the Ge subcell 106 generated by the chopped monochromatic light. If $v^b \ll V^B$ (i.e., assuming a small signal analysis), the exponential term in Equation 8 may be expanded using its Fourier series and simplified, using Equation 4 (which models the operation of subcell 106) as follows:

$$i_o = i_{ph}^b - \frac{r^b + r_{sh}}{r^b r_{sh}} v^b,$$ (Equation 9)

(small signal I-V equation for subcell 106)

Regarding the notation in Equation 9, $r^b$ may represent the small signal diode resistance associated with subcell 106, while $r_{sh}$ may represent the shunt resistance associated with subcell 106. $r^b$ and $r_{sh}$ may be defined at their DC operating points as follows:

$$r^b = \frac{dV^B}{dI^B}, \text{ and}$$ (Equation 10)

$$r_{sh} = \frac{dV^B}{dI_{SH}}.$$ (Equation 11)

Likewise, with respect to the two uppermost subcells 102 and 104 (neither of which are under test in this example), the I-V relationship for each under chopped monochromatic light may be written as follows:

$$I_O + i_o = I_{SC}^T - I_0^T e^{\frac{q(V^T + v^t)}{n^T kT}}$$ (Equation 12)

(I-V relationship for subcell 102), and $$I_O + i_o = I_{SC}^M + I_{LK}^{T,M} - I_0^M e^{\frac{q(V^M + v^m)}{n^M kT}}$$ (Equation 13)

(I-V relationship for subcell 104).

With reference to the notation used in Equations 12 and 13, $v^t$ and $v^m$ may represent the voltage drops of the subcells 102 and 104, respectively, generated in response to exposure to the chopped monochromatic (test) light. Further, as shown above with respect to subcell 106, output currents, $i_o$, may be obtained for subcells 102 and 104, respectively, using a small signal approximation as follows:

$$i_o = -\frac{v^t}{r^t},$$ (Equation 14)

(small signal I-V relationship for subcell 102), and $$i_o = -\frac{v^m}{r^m}$$ (Equation 15)

(small signal I-V relationship for subcell 104).

With reference to the notation used in Equations 14 and 15, $r^t$ and $r^m$ may represent the small signal diode resistances of the top and middle subcells 102 and 104, respectively.

Thus, a set of small signal equations may be developed, as shown above, to represent the output currents flowing in each of the subcells 102, 104, and 106 in response to a test wavelength range corresponding to subcell 106 (e.g. a Ge test wavelength range).

Likewise, a set of small signal equations may be developed, as shown below, to represent the output currents flowing in each subcell 102, 104, and 106 in response to a test wavelength range corresponding to subcell 104 (e.g., the InGaAs wavelength range). In this test range, the output current $i_o$ for the three subcells 102, 104, and 106, respectively, may be written as follows:

$$i_o = -\frac{v^t}{r^t},$$ (Equation 16)

$$i_o = i_{ph}^m - \frac{v^m}{r^m}, \text{ and}$$ (Equation 17)

$$i_o = a_{LK}^{T,M} i_{ph}^m - \left( \frac{1}{r^b} + \frac{1}{r_{sh}} \right) v^b.$$ (Equation 18)

With respect to the notation used in Equations 16-18, $i_{ph}^m$ may represent the photocurrent of subcell 104 (i.e., the InGaAs subcell) in this wavelength range. Moreover, as discussed to some extent above, the behavior of the three subcell equivalent circuits 102, 104, and 106 may be modeled by the equation:

$$v^t + v^m + v^b = i_o R_L$$ (Equation 19).

Thus, using Equations 9, 14, 15, and 19, the voltage drops of the subcells 102, 104, and 106 may be modeled for an input wavelength in the range of subcell 106 (e.g., the Ge range) as shown (Equations 20-22, respectively), while the output current may be modeled, again for a test wavelength in the range of subcell 106, as shown at Equation 23.

$$v^t = -r^t \left( i_{ph}^b \frac{r^b r_{sh}}{r^b + r_{sh}} \right) \bigg/ \left( r^t + r^m + \frac{r^b r_{sh}}{r^b + r_{sh}} + R_L \right)$$ (Equation 20)

$$v^m = -r^m \left( i_{ph}^b \frac{r^b r_{sh}}{r^b + r_{sh}} \right) \bigg/ \left( r^t + r^m + \frac{r^b r_{sh}}{r^b + r_{sh}} + R_L \right)$$ (Equation 21)

$$v^b = (r^t + r^m + R_L) \left( i_{ph}^b \frac{r^b r_{sh}}{r^b + r_{sh}} \right) \bigg/ \left( r^t + r^m + \frac{r^b r_{sh}}{r^b + r_{sh}} + R_L \right)$$ (Equation 22)

$$i_o = \left( i_{ph}^b \frac{r^b r_{sh}}{r^b + r_{sh}} \right) \bigg/ \left( r^t + r^m + \frac{r^b r_{sh}}{r^b + r_{sh}} + R_L \right)$$ (Equation 23)

Similarly, the voltage drops of the subcells 102, 104, and 106 and output current may be modeled for an input wavelength in the range of subcell 104 (e.g., the InGaAs range) using Equations 16-19. For example:

$$v^t = \qquad \text{(Equation 24)}$$
$$-r^t \left( i_{ph}^m r^m + a_{LK}^{T,M} i_{ph}^m \frac{r^b r_{sh}}{r^b + r_{sh}} \right) \bigg/ \left( r^t + r^m + \frac{r^b r_{sh}}{r^b + r_{sh}} + R_L \right)$$

$$v^m = r^m \left[ i_{ph}^m r^t + (1 - a_{LK}^{T,M}) i_{ph}^m \frac{r^b r_{sh}}{r^b + r_{sh}} + i_{ph}^m R_L \right] \bigg/ \qquad \text{(Equation 25)}$$
$$\left( r^t + r^m + \frac{r^b r_{sh}}{r^b + r_{sh}} + R_L \right)$$

$$v^b = \frac{r^b r_{sh}}{r^b + r_{sh}} [a_{LK}^{T,M} i_{ph}^m r^t + (a_{LK}^{T,M} - 1) i_{ph}^m r^m + a_{LK}^{T,M} i_{ph}^m R_L] \bigg/ \qquad \text{(Equation 26)}$$
$$\left( r^t + r^m + \frac{r^b r_{sh}}{r^b + r_{sh}} + R_L \right)$$

$$i_o = \left( i_{ph}^m r^m + a_{LK}^{T,M} i_{ph}^m \frac{r^b r_{sh}}{r^b + r_{sh}} \right) \bigg/ \left( r^t + r^m + \frac{r^b r_{sh}}{r^b + r_{sh}} + R_L \right) \qquad \text{(Equation 27)}$$

Accordingly, due to the low shunt resistance in the subcell 106 (e.g., the Ge subcell), the output current, $i_o$, shown in Equation 23 is typically less than the photocurrent, $i_{ph}^b$, in the wavelength range of subcell 106 (e.g., the Ge wavelength range) and also greater than the leakage current $\alpha_{LK}^{M,B} i_{ph}^m$ in the wavelength range of subcell 104 (e.g., the InGaAs wavelength range). These are the origins of common EQE measurement artifacts in the two wavelength ranges, respectively.

The above equations link the output current, $i_o$, in the Ge and InGaAs wavelength ranges, for example, to the subcell characteristics at the DC operating points. The DC voltage and light biases can therefore be used to control EQE measurement artifacts according to these equations. However, they typically are unsuitable for use to eliminate EQE artifacts.

Accordingly, in accordance with principles of the present disclosure and in various exemplary embodiments, for subcells with low shunt resistances and strong luminescence coupling effects, varying the DC bias conditions may not be sufficient to eliminate EQE measurement artifacts. Therefore, a "unity rule" may be used to recover the true EQE of a subcell. In an exemplary embodiment, the unity rule states:

$$\frac{i_o^t}{i_{ph}^t} + \frac{i_o^m}{i_{ph}^m} + \frac{i_o^b}{i_{ph}^b} = 1 \qquad \text{(Equation 28)}$$

In various exemplary embodiments, Equation 28 may be used where series resistance and light leakage may be neglected. Thus, according to Equation 28, the photocurrent $i_{ph}^b$ of the Ge subcell 106 may be obtained with the photocurrent $i_{ph}^t$ and $i_{ph}^m$ of the top and middle subcells, 102 and 104, respectively, and the measured output current $i_o^t$, $i_o^m$ and $i_o^b$ of the three subcells 102, 104, and 106 under a certain set of DC voltage and light biases.

In various embodiments, the applicability of the unity rule may be limited by one or more constraints. For example, the light leakage may not be negligible for some solar cells, and leakage light may generate EQE that decreases with decreasing wavelength (e.g., because the absorption coefficient is larger for higher energy photons). Moreover, the leakage strength may be larger for thinner subcells with lower absorption coefficients, and the series resistance may need to be considered in some cases. For example, if the voltage of the subcells 102, 104, and 106 is measured as the EQE response, the load resistor $R_L$ 110 may be necessary, and a large resistance may be desirable for a large measurement signal. In addition, the photocurrents of the top and middle subcells 104 and 106 may not be readily obtainable when they are influenced by large measurement artifact.

Pulsed Voltage Biasing

Figure 2:
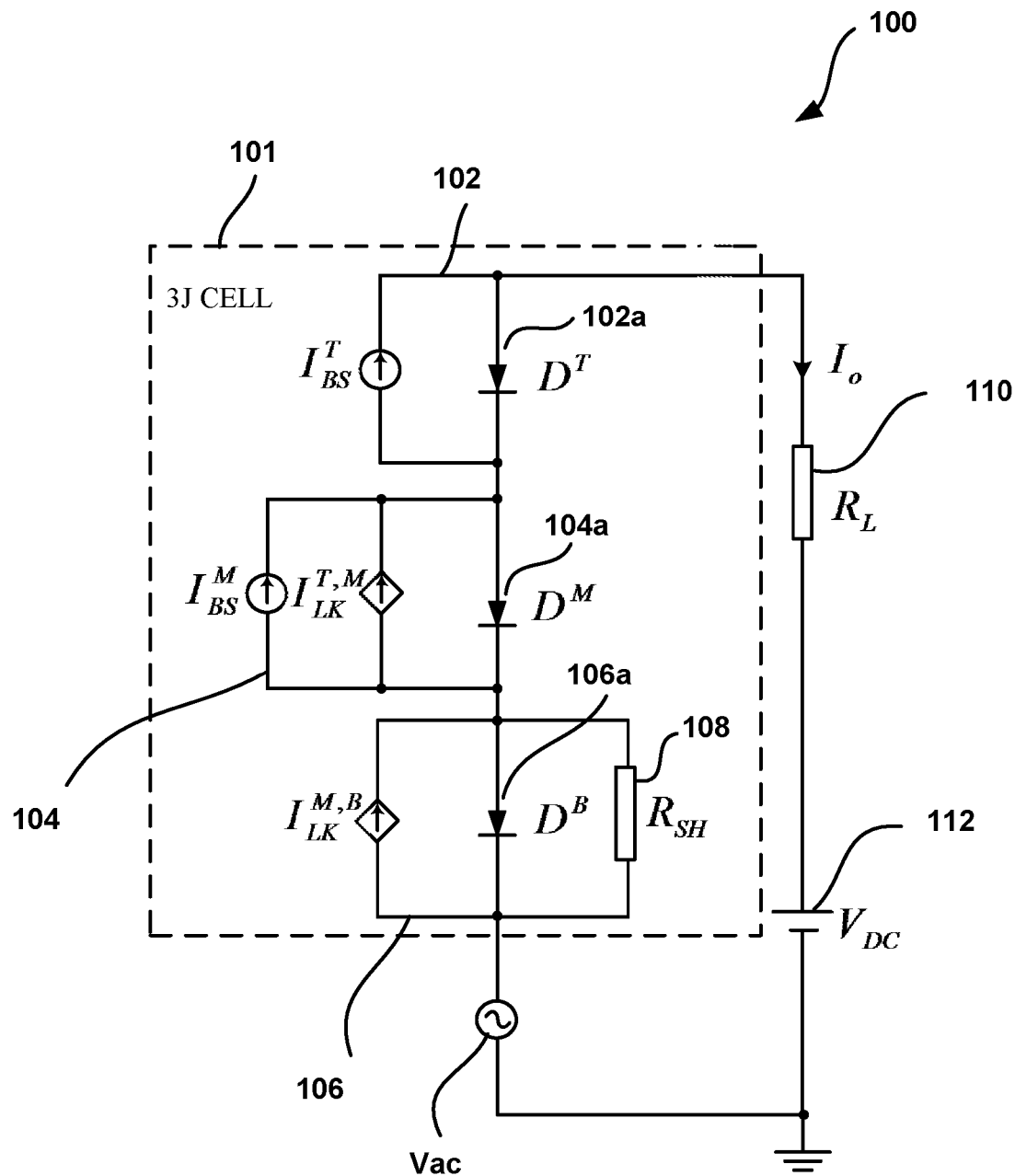
FIG. 2 illustrates an equivalent circuit of a bottom subcell of a triple-junction solar cell under pulsed voltage biases in accordance with an exemplary embodiment.

Turning now to FIG. 2, in various exemplary embodiments a more universal approach to control measured output current and eliminate measurement artifacts utilizes a pulsed voltage bias $v_{ac}$ 202 superimposed on the DC light and voltage biases as shown in FIG. 2. The pulsed voltage bias $v_{ac}$ 202 may be provided via any suitable mechanism, apparatus, and/or method, for example via a 780 nm laser diode synchronized to the chopper.

The voltage drops of the subcells in this case obey:

$$v^t + v^m + v^b = i_o R_L - v_{ac} \qquad \text{(Equation 29)}$$

If there is no measurement artifact in the wavelength range of subcell 106 (e.g., the Ge range), the output current may be expressed as follows:

$$i_o = i_{ph}^b \qquad \text{(Equation 30)}$$

Moreover, the subcell voltages $v_{ac}$ can be obtained from Equations (14), (15), (9), (29) and (30) as follows:

$$v^t = -i_{ph}^b r^t \qquad \text{(Equation 31)}$$

$$v^m = -i_{ph}^b r^m \qquad \text{(Equation 32)}$$

$$v^b = 0 \qquad \text{(Equation 33)}$$

$$v_{ac} = i_{ph}^b [r^t + r^m + R_L] \qquad \text{(Equation 34)}$$

In various embodiments, Equation 34 gives the necessary $v_{ac}$ 202 to recover the true EQE in the wavelength range of subcell 106 (e.g., the Ge range). Moreover, in various embodiments, when the measurement artifact is eliminated, there is no voltage drop on the subcell 106 as shown by Equation 33.

Further, if there is not a measurement artifact in the wavelength range of subcell 104 (e.g., in the InGaAs range), only leakage light may contribute to the output current. Thus, for example, the output current may be expressed as:

$$i_o = a_{LK}^{M,B} i_{ph}^m \qquad \text{(Equation 35)}$$

And, the subcell voltages and $v_{ac}$ 202 may be obtained from Equations 16, 18, 29, and 35 as follows:

$$v^t = -a_{LK}^{M,B} i_{ph}^m r^t \qquad \text{(Equation 36)}$$

$$v^m = (a_{LK}^{M,B} - 1) i_{ph}^m r^m \qquad \text{(Equation 37)}$$

$$v^b = 0 \qquad \text{(Equation 38)}$$

$$v_{ac} = i_{ph}^m [a_{LK}^{M,B} r^t + (a_{LK}^{M,B} - 1) r^m + a_{LK}^{M,B} + a_{LK}^{M,B} R_L] \qquad \text{(Equation 39)}$$

With respect to Equation 39, this equation gives the necessary $v_{ac}$ 202 to eliminate the erroneous EQE in the wavelength range of subcell 104 (e.g., the InGaAs wavelength range). Moreover, as shown above and in various exemplary embodiments, when the measurement artifact is eliminated, there is no voltage drop on the subcell 106, as shown by Equation 38.

In various exemplary embodiments, EQE measurements of the subcell 106 may be simulated, for example using SPICE and with the subcell parameters and bias conditions as shown in Table I, below. During simulation, the photocurrents $i_{ph}^b$ and $i_{ph}^m$ generated by the chopped monochromatic light in the wavelength range of subcell 106 (e.g., the Ge range) and the wavelength range of subcell 104 (e.g., the InGaAs wavelength range) may be assumed to be 50 μA peak-to-peak with a period of 30 milliseconds and a duty cycle of 50%.

TABLE I

SUBCELL PARAMETERS AND BIAS CONDITIONS USED IN SIMULATION

| | | | |
|---|---|---|---|
| $I_{0InGaP}$ (mA) | $4.16 \times 10^{-10}$ | $I_{BS}^{T}$ (mA) | 60 |
| $n_{InGaP}$ | 2 | $I_{BS}^{M}$ (mA) | 50 |
| $I_{0InGaAs}$ (mA) | $8 \times 10^{-6}$ | $V_{DC}$ (V) | 0 |
| $n_{InGaAs}$ | 2 | $\alpha_{LK}^{T,M}, \alpha_{LK}^{M,B}$ | 1% |
| $I_{0Ge}$ (mA) | $1.6 \times 10^{-4}$ | $R_{SH}^{T}$ (Ω) | $10^{10}$ |
| $n_{Ge}$ | 1 | $R_{SH}^{M}$ (Ω) | $10^{10}$ |
| $R_{L}$ (Ω) | 50 | $R_{SH}^{B}$ (Ω) | $10^{5} \exp[3\ V^{B}]$ |

Figure 3A:
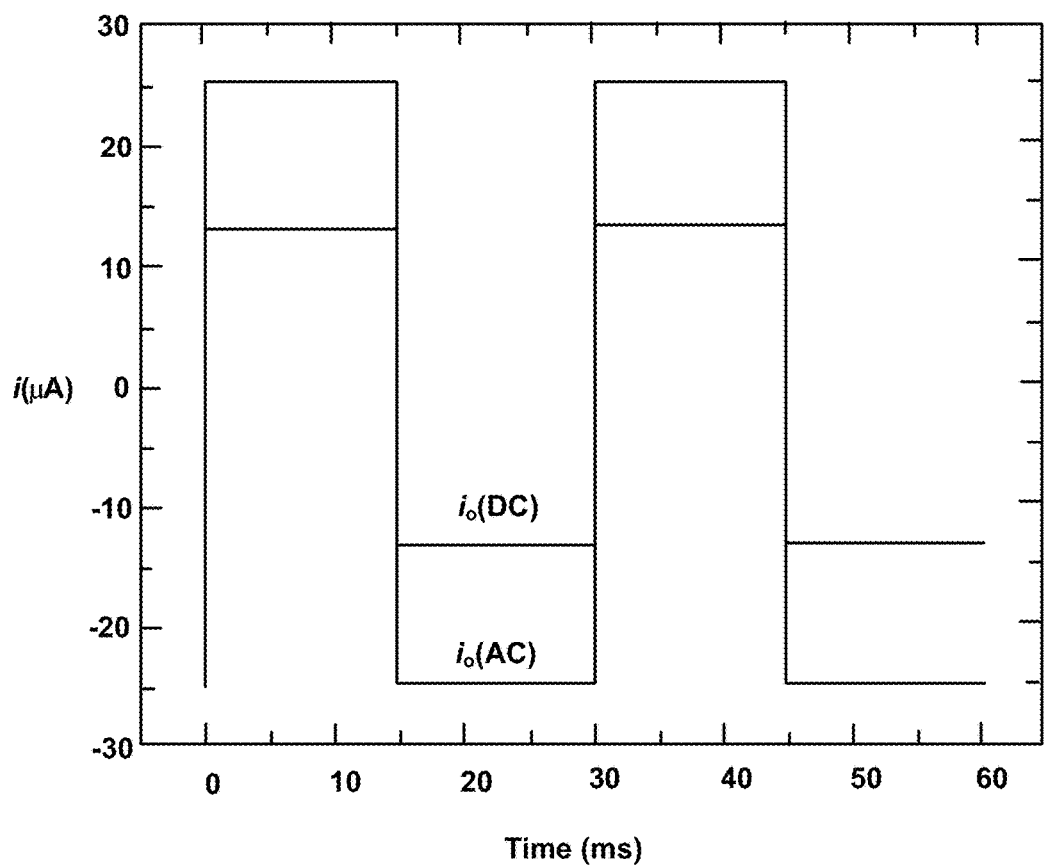
FIG. 3A illustrates simulation results in a wavelength range (e.g., a Ge range) of a bottom subcell in accordance with an exemplary embodiment.
Figure 3B:
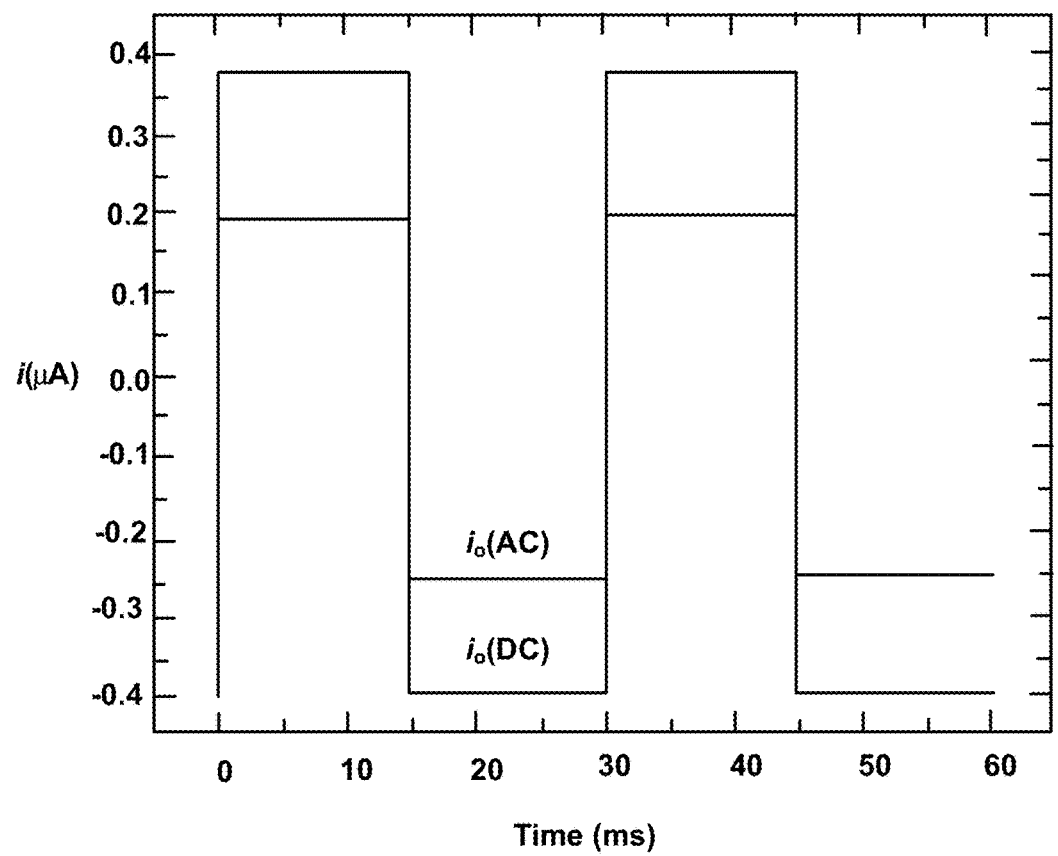
FIG. 3B illustrates simulation results in a wavelength range (e.g., an InGaAs range) of a middle subcell in accordance with an exemplary embodiment.

Referring now to FIGS. 3A and 3B, in accordance with various exemplary embodiments these figures show simulation results in the Ge wavelength range and in the InGaAs wavelength range, respectively. In various exemplary embodiments, due to the low shunt resistance of the Ge subcell at the operating point, the output current $i_o$(DC) under the DC bias conditions equals 52.6% of the photocurrent $i_{ph}^{b}$ of the Ge subcell 106 in the Ge wavelength range, and equals about 1.6% of the photocurrent $i_{ph}^{m}$ of the InGaAs subcell 104 in the InGaAs wavelength range. The small signal resistances of the InGaP subcell 102, InGaAs subcell 104 and Ge subcell 106 are, in various embodiments and according to the simulation described above, $r^t$=0.93Ω, $r^m$=1.13Ω and $r^b$=57.68Ω at the operating points, respectively. Thus, to eliminate EQE measurement artifacts, $v_{ac}$ 202 may be set equal to 2.6 mV peak-to-peak and in phase with $i_{ph}^{b}$ in the Ge wavelength range according to Equation 34. Similarly, according to Equation 39, $v_{ac}$ 202 may be set equal to 30.68 μV peak-to-peak and in anti-phase with $i_{ph}^{m}$ in the InGaAs wavelength range. Moreover, as also shown in FIGS. 3A and 3B, the output current $i_o$ (AC) with the AC voltage bias is equal, in various embodiments, to $i_{ph}^{b}$ in the Ge wavelength range and is 1% of $i_{ph}^{m}$ due to the leakage current in the InGaAs wavelength range. Thus, using a pulsed DC voltage bias, $v_{ac}$ 202, the EQE measurement artifacts may be reduced, minimized, and/or eliminated.

In various exemplary embodiments, a pulsed voltage bias is superimposed on the conventional DC voltage and light biases. In an exemplary embodiment, a square-wave voltage source with a voltage divider consisting of two resistors is added into the bias circuit. The voltage divider makes it possible to obtain a suitable bias voltage to reduce, minimize, and/or eliminate the measurement artifacts. The square-wave voltage is synchronized to the monochromatic light that generates the EQE response. The magnitude of the square-wave voltage is obtained by varying this bias voltage and measuring the EQE response iteratively.

Pulsed Light Biasing

Further, in various exemplary embodiments, measurement artifacts may be reduced, minimized, and/or eliminated using one or more pulsed light biases ("PLB"), for example either in combination with a pulsed DC voltage bias, as described above, or absent DC voltage biases. In various exemplary embodiments, a small signal light bias may be applied to subcells 102 and/or 104 in phase with a small signal light bias applied to subcell 106, so that the subcell voltages are kept the same during measurement of EQE.

In various embodiments, EQE measurements of a MJSC may be performed by scanning the wavelength of a chopped probing monochromatic light, while the subcells not under test are light biased.

Figure 4A:
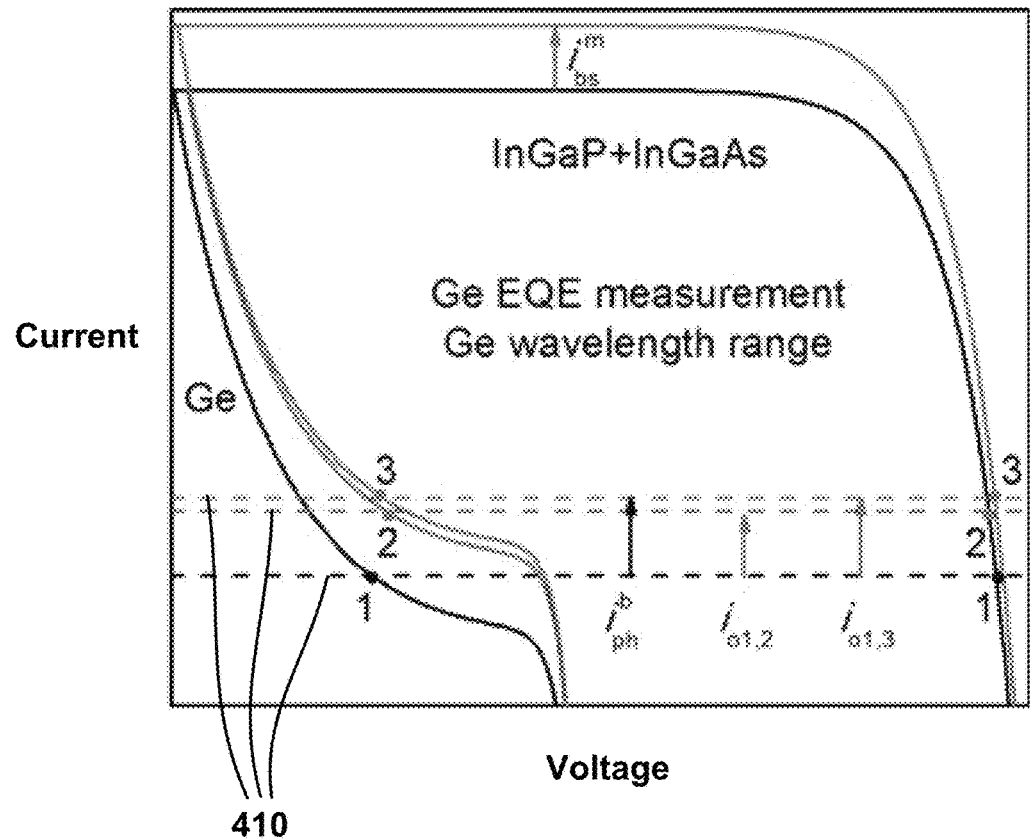
FIG. 4A illustrates exemplary Ge EQE measurements in the Ge wavelength range in accordance with an exemplary embodiment.
Figure 4B:
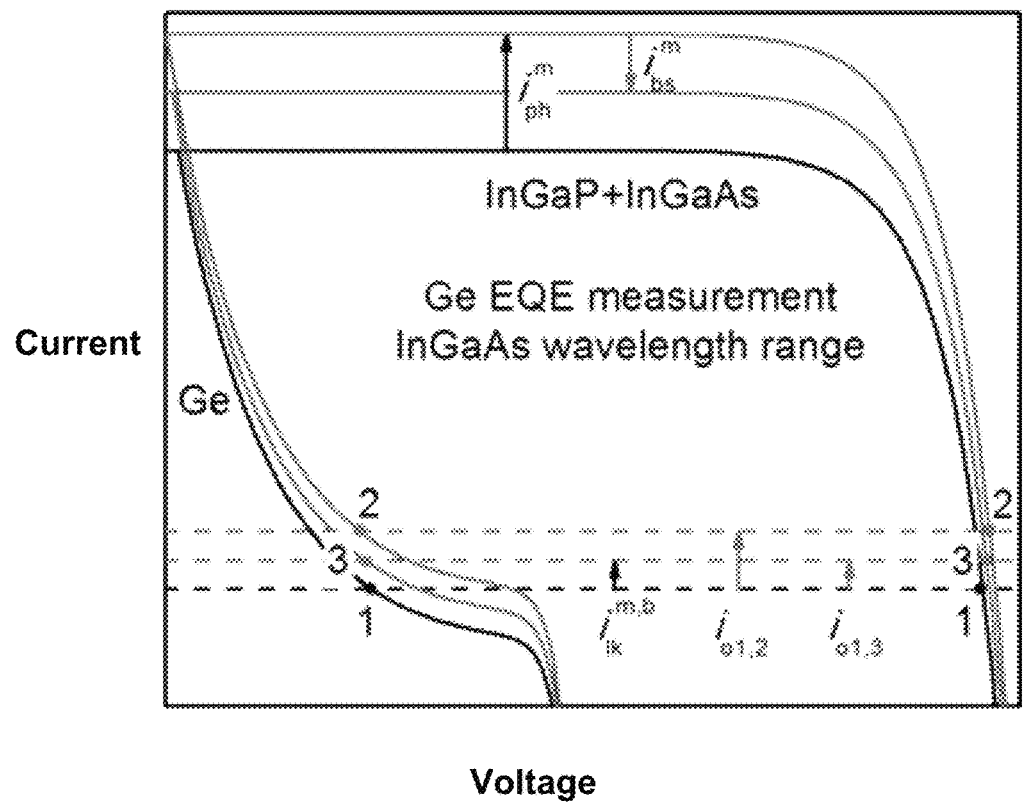
FIG. 4B illustrates exemplary Ge EQE measurements in the InGaAs wavelength range in accordance with an exemplary embodiment.

Referring now to FIGS. 4A and 4B, in accordance with various exemplary embodiments schematic subcell I-V curves of an InGaP/InGaAs/Ge triple junction solar cell are illustrated in the EQE measurements of the Ge subcell in the Ge wavelength range and in the InGaAs wavelength range, respectively. In various embodiments, the top subcell may comprise an InGaP subcell, the middle subcell may comprise an InGaAs subcell, and the bottom subcell may comprise a Ge subcell. However, any suitable number of subcells and/or subcell materials may be utilized, as desired. The InGaP and InGaAs subcells may be light biased and, therefore, generate large short-circuit currents. The Ge subcell may be current limiting, and the Ge subcell may have a soft breakdown under reverse bias.

In this example, the output currents from the MJSC are shown by dashed lines 410. The intersections of the subcell I-V curves and the output current are the subcell operating point. The subcells may work at points 1 under DC bias condition and points 2 where the probing monochromatic light is on. The incremental current from points 1 to points 2 is the ac output current $i_{o1,2}$ that is measured as the apparent spectral response of the Ge subcell. The Ge cell I-V curve is tilted at the operating points because of the low shunt resistance. Moreover, the luminescence coupling effect causes a negative feedback on the output current in the Ge wavelength range and an additional photocurrent in the InGaAs wavelength range. As a result, $i_{o1,2}$ in the Ge wavelength range, as shown in FIG. 4A, is smaller than the true spectral response $i_{ph}^{b}$ generated by the Ge subcell absorbing the probing monochromatic light. $i_{o1,2}$ as shown in FIG. 4B is larger than the true spectral response $i_{lk}^{m,b}$, i.e., the optical leakage current generated by the Ge subcell absorbing the unabsorbed probing monochromatic light from the InGaAs subcell. These may be the origins of certain EQE measurement artifacts.

In order to reduce, minimize, and/or eliminate such measurement artifacts, a PLB may be applied to the InGaAs subcell and generate an ac photocurrent $i_{bs}^{m}$ to correct the discrepancy between the measured apparent spectral response $i_o$ and the true spectral response.

More specifically, the PLB causes the photocurrent of the InGaAs subcell to increase or decrease by $i_{bs}^{m}$ (for example, in the Ge wavelength range as illustrated in FIG. 4A, or the InGaAs wavelength range as illustrated in FIG. 4B). As a result, the subcell operating points may be moved from points 2 to points 3 under the probing monochromatic light, where the measured apparent spectral response $i_{o1,3}$ may be equal to the photocurrent $i_{ph}^{b}$ in the Ge wavelength range, as shown in FIG. 4A, and the optical leakage current $i_{lk}^{m,b}$ in the InGaAs wavelength range, as shown in FIG. 4B. Therefore, EQE measurement artifacts may be reduced, minimized, and/or eliminated.

Figure 5A:
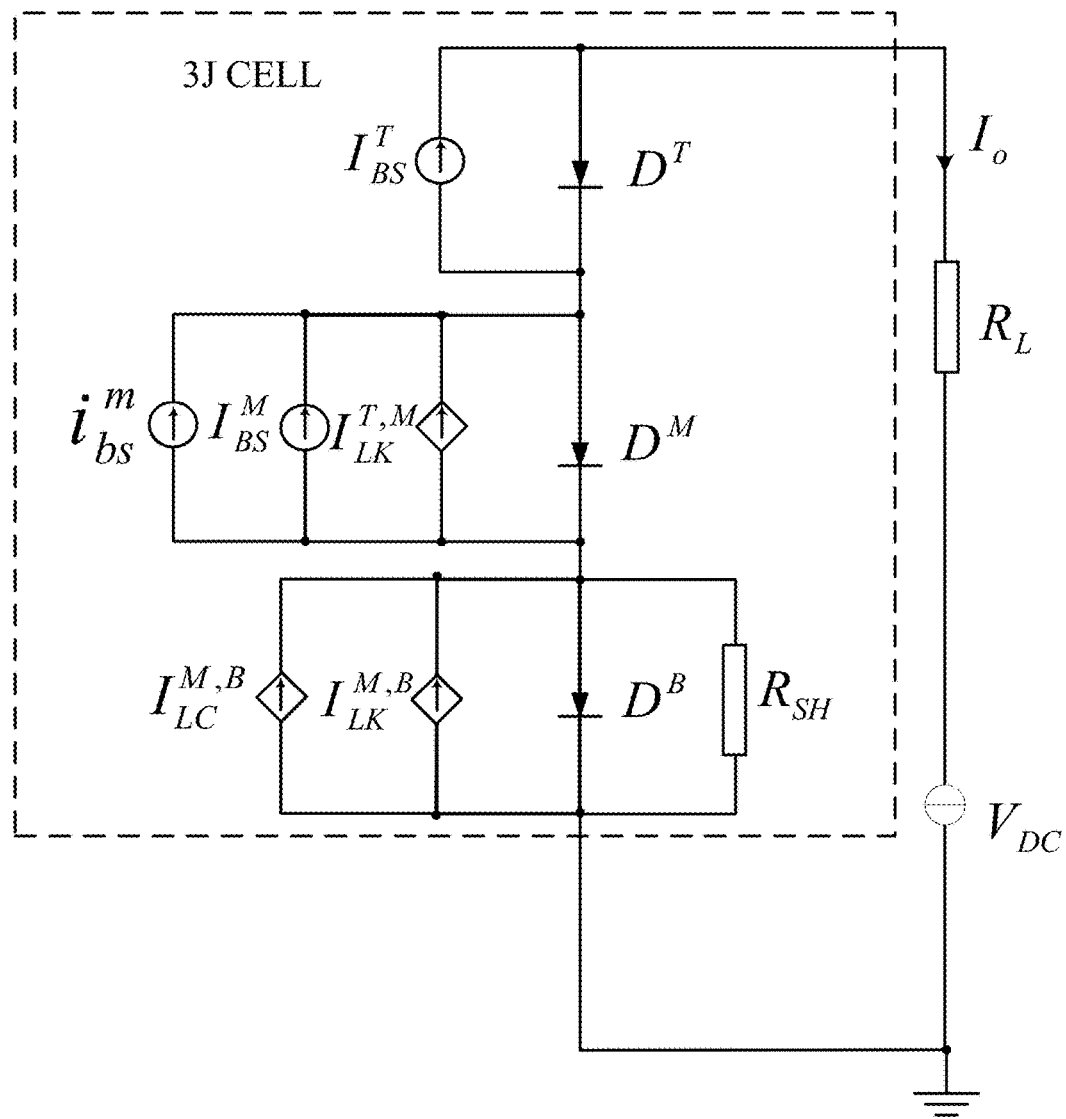
FIG. 5A illustrates simulation results in a MJSC under a bias condition in accordance with an exemplary embodiment.
Figure 5B:
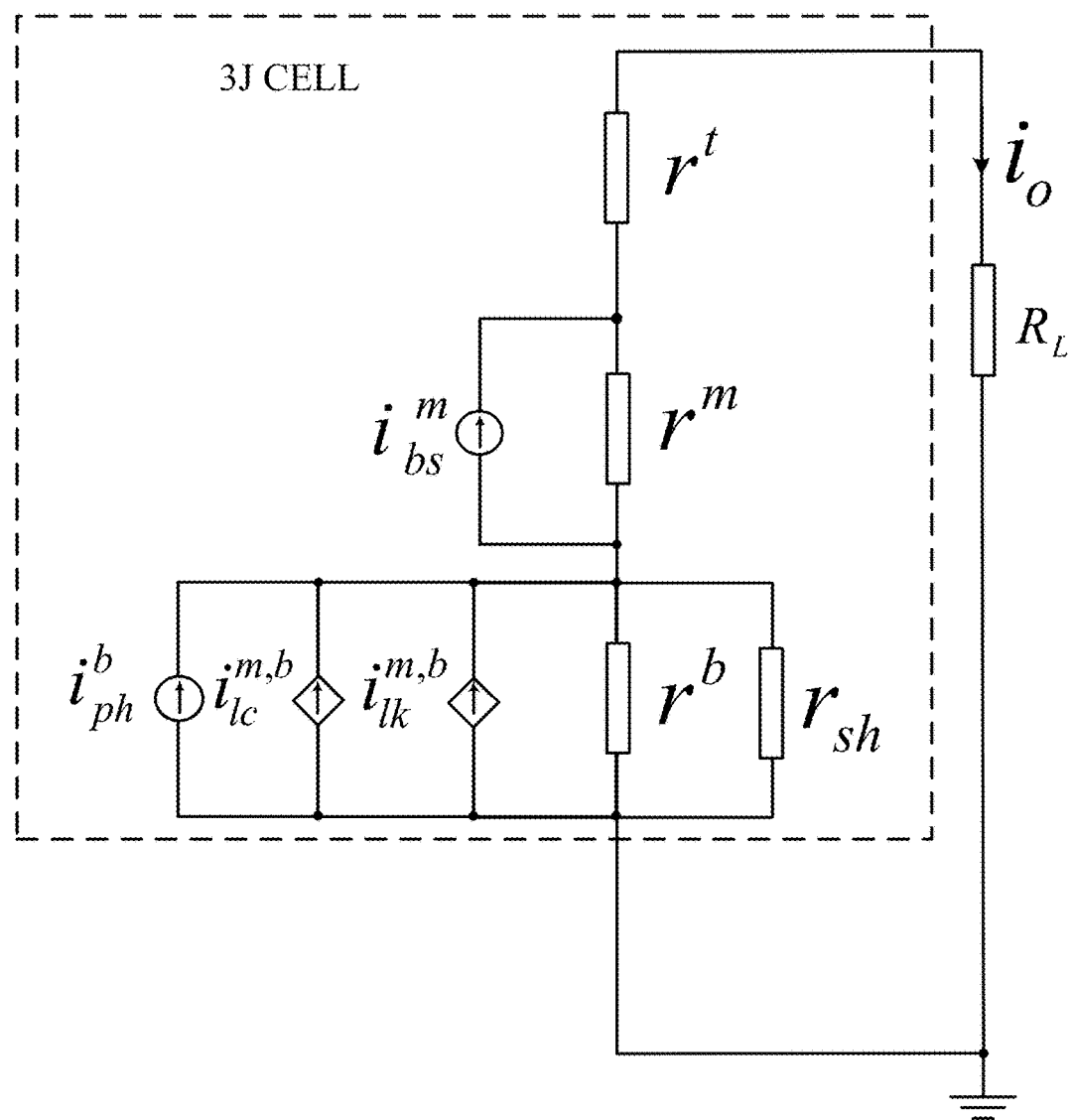
FIG. 5B illustrates simulation results in a MJSC under the probing monochromatic light scanning through the a wavelength range (e.g. a Ge range) in accordance with an exemplary embodiment.
Figure 5C:
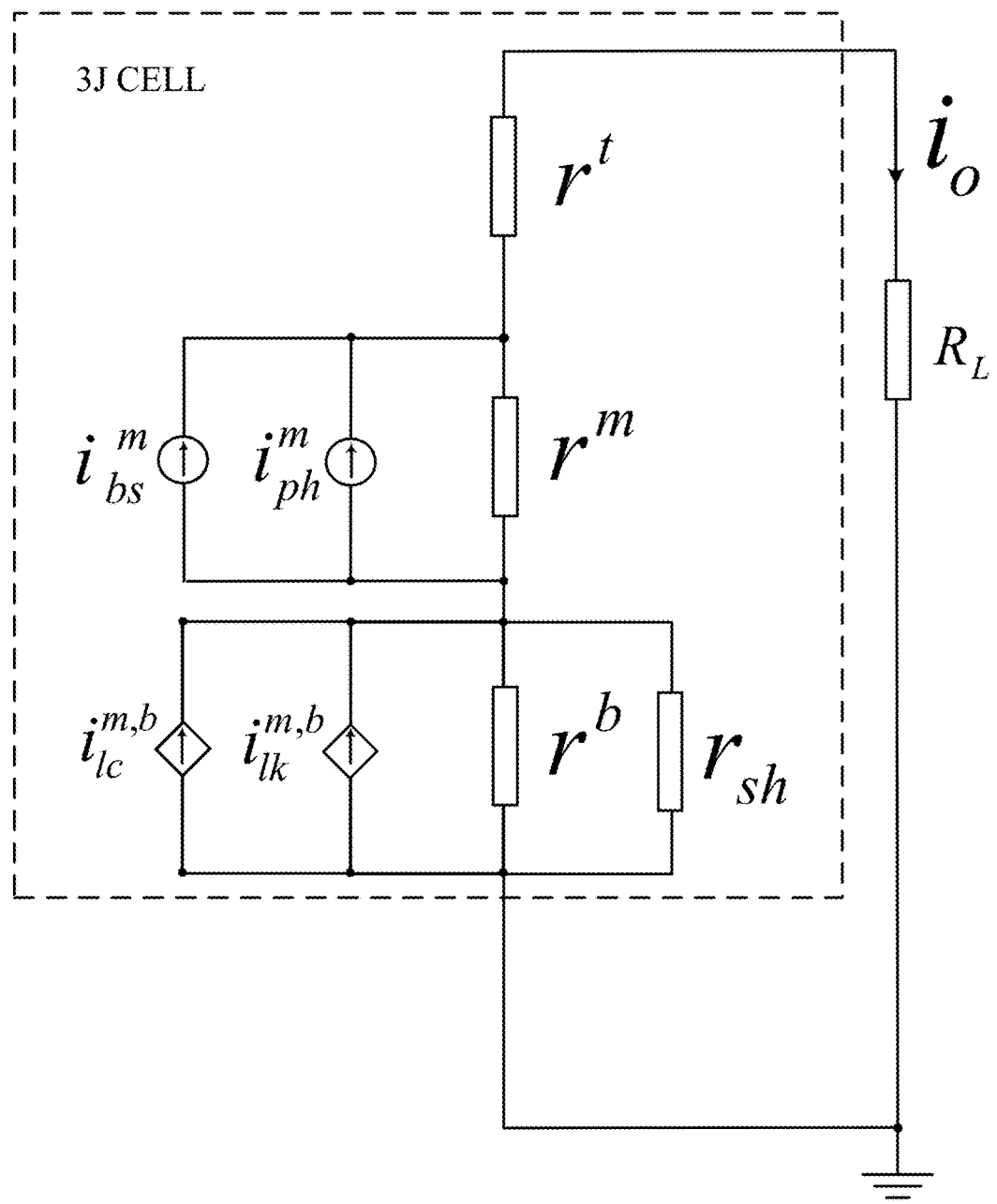
FIG. 5C illustrates simulation results in a MJSC under the probing monochromatic light scanning through a wavelength range (e.g. an InGaAs range) in accordance with an exemplary embodiment.

Referring now to FIGS. 5A through 5C, in accordance with principles of the present disclosure, in various exemplary embodiments exemplary circuit models are illustrated for quantitatively studying the coupling effects between the subcells. In FIG. 5A, a bias condition with the PLB $i_{bs}^{m}$ on the InGaAs subcell is illustrated. In FIG. 5B, a model for measurement of the Ge subcell under a probing monochromatic light scanning through the Ge wavelength range is illustrated. In FIG. 5C, a model for measurement of the Ge subcell under a probing monochromatic light scanning through the InGaAs wavelength range is illustrated.

As illustrated by the bias condition in FIG. 5A, the InGaP subcell $D^T$ and InGaAs subcell $D^M$ are light biased and generate the photocurrent $I_{BS}^{T}$ and $I_{BS}^{M}$ respectively. Because the bias light on an upper subcell may not be completely absorbed, the unabsorbed bias light may generate additional photocurrent in the lower subcell. This optical leakage current may be modeled as a current controlled current source $I_{LK}^{T,M} = \alpha_{LK}^{T,M} I_{BS}^{T}$ from the top to the middle subcell, and $I_{LK}^{M,B} = \alpha_{LK}^{M,B} I_{BS}^{M}$ from the middle to the bottom subcell. The leakage strengths $\alpha_{LK}^{T,M}$ and $\alpha_{LK}^{M,B}$ are wavelength dependent constants. Moreover, the radiative recombination in an upper subcell with a larger bandgap may generate photons that can be reabsorbed in the lower subcell. This luminescence coupling effect may be modeled as a current controlled current source.

In various exemplary embodiments, the InGaP and InGaAs subcells may be forward biased under their respective light biases, and the effect of their shunt resistances may be neglected. The Ge subcell may be reverse biased or weakly forward biased under the dc bias voltage $V_{DC}$ and the unintentional light bias from the leakage light and luminescence coupling. The probing monochromatic light generates an ac photocurrent shown as the current source $i_{ph}^b$ on the Ge subcell in FIG. 5B and the current source $i_{ph}^m$ on the InGaAs subcell in FIG. 5C. In order to reduce, minimize, and/or eliminate EQE measurement artifacts, the PLB $i_{bs}^m$ may be added to the light bias.

In various exemplary embodiments, a suitable PLB to reduce, minimize, and/or eliminate EQE measurement artifacts may be derived from the small-signal models in FIGS. 5B and 5C. In the Ge wavelength range, the output current may be described as:

$$i_0 = \frac{\bar{i}_{bs}^{-m}[r^m + (\alpha_{ik}^{m,b} + \alpha_{ic}^{m,b})r^b r_{sh}/(r^b + r_{sh})] + \bar{i}_{ph}^{-b} r^b r_{sh}/(r^b + r_{sh})}{r^t + r^m + (1 + \alpha_{ic}^{m,b})r^b r_{sh}/(r^b + r_{sh}) + R_L} \quad \text{(Equation 40)}$$

When the EQE measurement artifact is eliminated, the output current $i_o$ may be equal to the photocurrent $i_{ph}^b$ of the subcell. Substituting this condition into Equation 40, a suitable photocurrent $i_{bs}^{m0}$ to eliminate the EQE measurement artifact can be obtained as:

$$\bar{i}_{bs}^{m0} = \frac{\bar{i}_{ph}^{-b}(r^t + r^m + \alpha_{ik}^{m,b} + \alpha_{ic}^{m,b} r^b r_{sh}/(r^b + r_{sh}) + R_L)}{r^m + (\alpha_{1c}^{m,b} + \alpha_{1k}^{m,b})r^b r_{sh}/(r^b + r_{sh})} \quad \text{(Equation 41)}$$

Equation 41 illustrates that $i_{bs}^{m0}$ is in phase with $i_{ph}^b$. In various embodiments, $i_{bs}^{m0}$ may be obtained by varying $i_{bs}^m$ and measuring $i_o$ iteratively until Equation 41 is satisfied. When the equation is satisfied, $i_o$ may yield the true EQE of the Ge subcell.

In the InGaAs wavelength range, the output current $i_o$ may be described as:

$$i_0 = \frac{(\bar{i}_{ph}^{-m} + \bar{i}_{bs}^{-m})[r^m + (\alpha_{1k}^{m,b} + \alpha_{1c}^{m,b})r^b r_{sh}/(r^b + r_{sh})]}{r^t + r^m + (1 + \alpha_{1c}^{m,b})r^b r_{sh}/(r^b + r_{sh}) + R_L} \quad \text{(Equation 42)}$$

When the measurement artifact is eliminated, $i_o$ is equal to the optical leakage current $i_{lk}^{m,b}$ generated by the unabsorbed monochromatic light from the InGaAs subcell, i.e., $a_{lk}^{m,b} i_{ph}^m$. Substituting this condition into Equation 42, a suitable photocurrent $i_{bs}^{m0}$ to eliminate the measurement artifact may be obtained as:

$$\bar{i}_{bs}^{m0} = \bar{i}_{ph}^{-m} \frac{\alpha_{1k}^{m,b} r^t + (\alpha_{1k}^{m,b} - 1)r^m + (\alpha_{1k}^{m,b} - 1)\alpha_{1k}^{m,b} r^b + r_{sh}/(r^b + r_{sh}) + \alpha_{1k}^{m,b} R_L}{r^m + (\alpha_{1c}^{m,b} + \alpha_{1k}^{m,b})r^b r_{sh}/(r^b + r_{sh})} \quad \text{(Equation 43)}$$

Equation 43 shows that $i_{bs}^{m0}$ if may be obtained directly when the photocurrent $i_{ph}^m$ of the InGaAs subcell can be accurately measured under a DC bias condition. In addition, in various embodiments $i_{bs}^{m0}$ may be in antiphase with $i_{ph}^m$, because the term associated with the bottom subcell usually dominates in the numerator of Equation 43.

In various exemplary embodiments, where Ge subcells have weak luminescence coupling from the InGaAs subcells due to low material quality or under weak bias light intensity, Equation 41 and Equation 43 may be simplified by neglecting the luminescence coupling strength. In other exemplary embodiments where high-quality Ge subcells have large small-signal resistances and strong luminescence coupling from the InGaAs subcells at the operating points, Equation 41 and Equation 43 may be simplified by neglecting or cancelling out the small-signal resistances of the three subcells.

Figure 6:
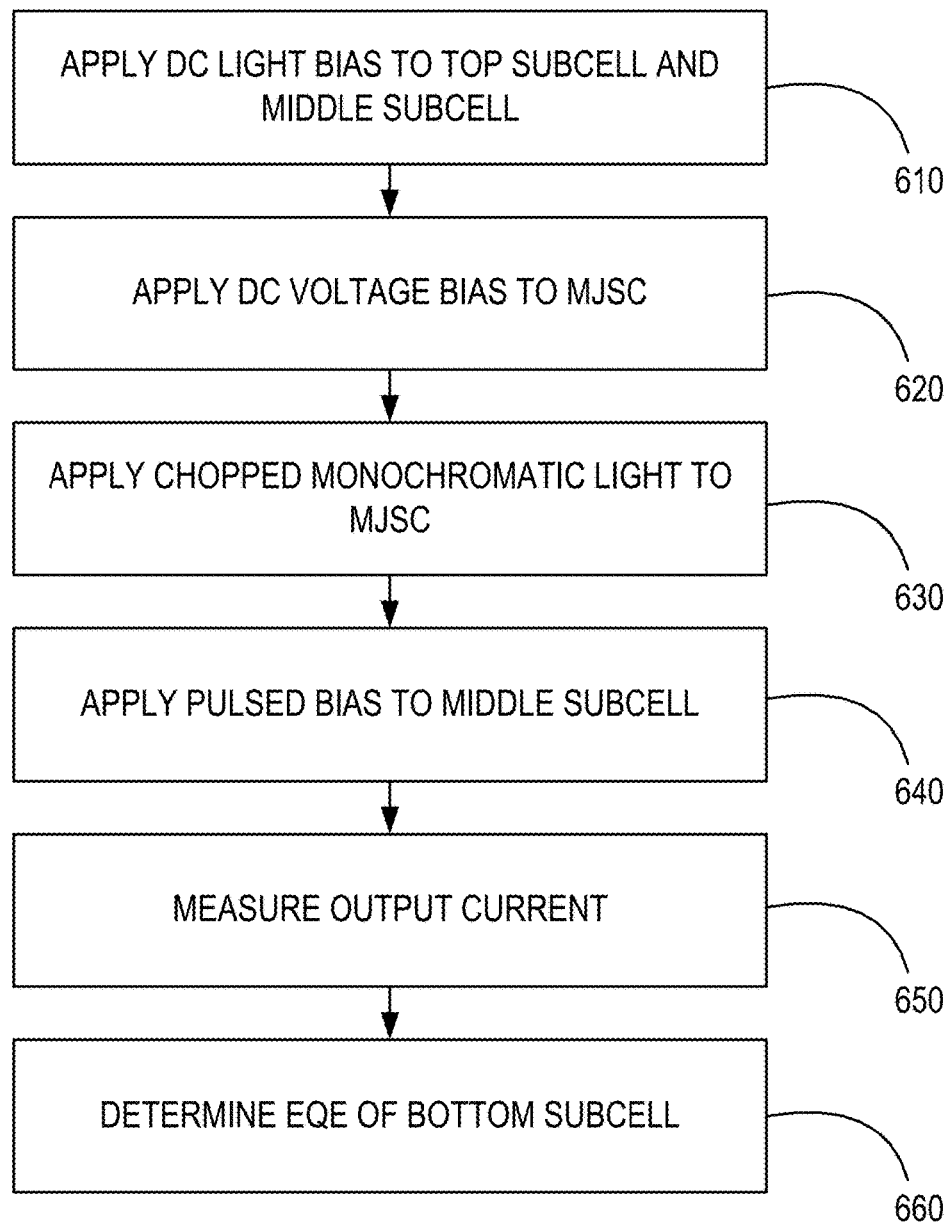
FIG. 6 illustrates an exemplary process for measuring the EQE of a subcell in a MJSC in accordance with an exemplary embodiment.

Referring now to FIG. 6, a process for measuring the EQE of a subcell is illustrated according to various exemplary embodiments. The subcell may be a Ge subcell in a multi-junction solar cell (MJSC). In various embodiments, the MJSC may be a triple-junction solar cell. In various embodiments, the triple-junction solar cell may comprise a top subcell comprising InGaP, a middle subcell comprising InGaAs, and a bottom subcell comprising Ge. However, any suitable MJSC construction may be utilized and/or characterized, and the principles of the present disclosure may be applied thereto.

In an exemplary embodiment, a DC light bias is applied to at least one of the top subcell and the middle subcell of the MJSC (step 610). A DC voltage bias is applied to the MJSC (step 620). A chopped monochromatic light is applied to the MJSC in a wavelength range to which the bottom subcell is tuned (step 630). The chopped monochromatic light may generate a photocurrent in at least one of the subcells.

At least one of a pulsed voltage bias (PVB) and a pulsed light bias (PLB) is applied to the middle subcell (step 640). The PVB and/or PLB may generate an AC photocurrent $i_{bs}^m$. In various embodiments, the PVB may be generated by a square wave voltage generator. In various embodiments, the PLB may be generated by a laser diode, such as a 780-nm laser diode operating at 156.2 Hz. In various embodiments, the PLB may be synchronized to the probing monochromatic light. In various embodiments, a neutral density filter is used to reduce the light intensity from the laser diode and make the photocurrent $i_{bs}^m$ comparable with the photocurrent generated by the probing monochromatic light. In various embodiments, $i_{bs}^m$ may be measured when an additional light bias of a 980-nm laser is applied to the bottom subcell to make the middle subcell current limiting.

The output current may be measured (step 650). The output current is used to determine whether an equation is satisfied (step 660), such as Equation 41. In various exemplary embodiments, the photocurrent may be modified iteratively until the equation is satisfied. When the equation is satisfied, the true EQE of the bottom subcell may be determined.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

What is claimed is:

1. A method for eliminating external quantum efficiency measurement artifacts in a multi junction solar cell (MJSC), the method comprising:
    applying a continuous light bias to a first subcell in the MJSC, wherein the first subcell is not under test;
    applying a DC voltage bias to the MJSC to make a second subcell in the MJSC the current limiting subcell;
    applying a pulsed voltage bias having a period of about 30 milliseconds to the first subcell; and
    measuring an external quantum efficiency of the second subcell while the pulsed voltage bias is being applied to the first subcell.

2. The method of claim 1, wherein the measuring the external quantum efficiency of the second subcell comprises applying a probing monochromatic light to the MJSC.

3. The method of claim 2, wherein the probing monochromatic light comprises a chopped monochromatic light.

4. The method of claim 2, wherein the probing monochromatic light causes the second subcell to create a photocurrent.

5. The method of claim 2, wherein the measuring the external quantum efficiency of the second subcell comprises measuring an output current from the MJSC.

6. The method of claim 1, wherein the pulsed voltage bias is superimposed on at least one of the continuous light bias and the DC voltage bias.

7. The method of claim 1, wherein the pulsed voltage bias is generated by a square wave voltage source synchronized to a probing monochromatic light, the square wave voltage source having a period of about 30 milliseconds and a duty cycle of about 50%.

8. The method of claim 1, further comprising calculating a value for the pulsed voltage bias necessary to eliminate the measurement artifacts.

9. The method of claim 1, further comprising measuring an external quantum efficiency response of the second subcell iteratively, and varying the magnitude of the pulsed voltage bias.

10. A method for reducing external quantum efficiency measurement artifacts in a multi junction solar cell (MJSC) comprising a top subcell, a middle subcell, and a bottom subcell, the method comprising:
    applying a continuous light bias to the top subcell and the middle subcell, wherein the top subcell and the middle subcell are not under test;
    applying a DC voltage bias to the MJSC to make a shunt effect in the bottom subcell comparable to a luminescence coupling effect;
    applying a pulsed light bias generated by a laser diode to the middle subcell; and
    measuring an external quantum efficiency of the bottom subcell while the pulsed light bias is being applied to the middle subcell.

11. The method of claim 10, wherein the DC voltage bias is selected to minimize a shunt effect in the bottom subcell.

12. The method of claim 10, further comprising applying the pulsed light bias to the top subcell.

13. The method of claim 10, further comprising determining a magnitude of the pulsed light bias necessary to eliminate the measurement artifacts.

14. The method of claim 13, wherein the determining comprises iteratively measuring a photocurrent generated by the bottom subcell.

15. The method of claim 10, wherein the top subcell comprises InGaP, the middle subcell comprises InGaAs, and the bottom subcell comprises Ge.

16. The method of claim 10, wherein the pulsed light bias causes the middle subcell to generate an AC photocurrent to correct a discrepancy between a measured apparent spectral response of the bottom subcell and a true spectral response of the bottom subcell.

17. The method of claim 1, wherein the pulsed voltage bias has an amplitude of less than 3 millivolts.

18. The method of claim 10, wherein the laser diode has a wavelength of 780 nm and is operative at between 156 and 157 Hz.

* * * * *